United States Patent
Tamaki et al.

(10) Patent No.: US 6,794,677 B2
(45) Date of Patent: Sep. 21, 2004

(54) SEMICONDUCTOR INTEGRATED CIRCUIT DEVICE AND METHOD FOR FABRICATING THE SAME

(75) Inventors: Tokuhiko Tamaki, Osaka (JP); Koichi Kawashima, Kyoto (JP); Yasuo Sakurai, Kyoto (JP); Kenji Tateiwa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 168 days.

(21) Appl. No.: 09/964,868

(22) Filed: Sep. 28, 2001

(65) Prior Publication Data

US 2002/0061652 A1 May 23, 2002

(30) Foreign Application Priority Data

Oct. 2, 2000 (JP) ........................................ 2000-302277

(51) Int. Cl.[7] ...................... H01L 29/06; H01L 31/0352
(52) U.S. Cl. .............................. 257/41; 257/2; 257/390; 257/401
(58) Field of Search ...................... 257/41, 2, 202–211, 257/390, 401

(56) References Cited

U.S. PATENT DOCUMENTS

| | | | | |
|---|---|---|---|---|
| 5,410,161 A | * | 4/1995 | Narita | 257/41 |
| 5,598,010 A | * | 1/1997 | Uematsu | 257/48 |
| 5,698,902 A | * | 12/1997 | Uehara et al. | 257/773 |
| 5,847,421 A | * | 12/1998 | Yamaguchi | 257/207 |
| 5,943,256 A | * | 8/1999 | Shimizu et al. | 365/145 |
| 5,952,698 A | * | 9/1999 | Wong et al. | 257/401 |

FOREIGN PATENT DOCUMENTS

| | | |
|---|---|---|
| JP | 60124941 | 7/1985 |
| JP | 03180041 | 8/1991 |
| JP | 07335844 | 12/1995 |
| JP | 10-200109 | 7/1998 |
| JP | 2000-150828 | 5/2000 |

* cited by examiner

*Primary Examiner*—Duy-Vu Deo
(74) *Attorney, Agent, or Firm*—McDermott, Will & Emery

(57) ABSTRACT

Variations in the size of a linear pattern resulting from difference in mask pattern layout are prevented by setting the perimeter of the linear pattern per unit area in a specified range irrespective of the type of a semiconductor integrated circuit device or by adjusting a process condition in accordance with type-to-type difference in the perimeter of the linear pattern per unit area.

6 Claims, 9 Drawing Sheets

SEMICONDUCTOR INTEGRATED CIRCUIT DEVICE AND METHOD FOR FABRICATING THE SAME

BACKGROUND OF THE INVENTION

The present invention relates to a semiconductor integrated circuit device and a method for fabricating the same. More particularly, it relates to technology for forming a linear pattern composed of the gate electrode and wires of a MOS transistor, or metal wires, and the like in a system LSI in which a group of elements having an extremely fine repetitive pattern, such as DRAMs (Dynamic Random Access Memories), can be merged.

As an example of a semiconductor integrated circuit device in which DRAMs are merged, a system LSI on which DRAMs having a capacity over 20 megabits are mounted has been mass-produced in recent years.

In the fabrication steps for a semiconductor integrated circuit device represented by the system LSI in which the mounting rate of memory circuits such as DRAMs, SRAMs (Static Random Access Memories), or ROMs (Read Only Memories) on a single semiconductor chip (rate of an area occupied by the memory circuits to an area of the entire chip; hereinafter also referred to as an area-occupying rate) differs according to usage or specifications, the formation of a mask pattern having not only unit circuits which are simply and repeatedly arranged therein but also a variety of layouts has been required.

There has conventionally been known a phenomenon in which the configuration or size of a pattern obtained by etching a target film by using a mask pattern (hereinafter referred to as a formed pattern) differs depending on a mask pattern layout, i.e., the placement of an element pattern.

As an example of the phenomenon, a pattern proximity effect occurring during the formation of a resist pattern in a photolithographic step can be listed. This is the phenomenon in which even a pattern having the same design configuration and the same design size has different configurations and sizes after it is formed depending on the degree of proximity between the pattern and a pattern adjacent thereto or on the configuration of the adjacent pattern.

As another example, there can be listed a loading effect or a microloading effect occurring in a dry etching step. The loading effect is a phenomenon in which an etching rate varies depending on the size of a total etched area of a semiconductor chip, which may slightly affect variations in pattern size. The microloading effect is a phenomenon in which, when a pattern laid out in a single semiconductor chip shows an arrangement which is locally sparse and dense, an etching rate differs locally due to the locally dense and sparse arrangement. That is, the etching rate for even the single chip differs from the portion thereof on which the pattern is sparsely placed to the portion thereof on which the pattern is densely placed, which also indirectly affects variations in pattern size.

To solve the foregoing problem of variations in pattern size depending on the mask pattern layout, there have conventionally been adopted such design rules as to correct variations in pattern size only at a portion of a mask where the pattern size is considered to vary remarkably depending on the mask pattern layout due to the proximity effect or the loading effect.

On the other hand, the fabrication of a system LSI in which DRAMs can be merged has used the same processing method or the same processing condition irrespective of the presence or absence of a mounted DRAM or of a DRAM area-occupying rate (the rate of an area occupied by the DRAMs to the area of an entire chip).

With the increasing miniaturization of the LSI, specifically as the size of an integrated circuit pattern is reduced to 0.25 μm or less, particularly to 0.15 μm or less, higher-precision size control has been required so that size variations resulting from difference in mask pattern layout are no more negligible.

FIG. 8 shows the frequency distribution of a CD (critical dimension) loss which is the difference between the size of a resist pattern prior to etching and the size of a completed gate electrode when the gate electrode is formed by dry etching by using the resist pattern as a mask in the fabrication of each of semiconductor integrated circuit devices on which 24 Mb DRAMs are mounted (hereinafter referred to as a DRAM mounted type) and a semiconductor integrated circuit device on which DRAMs are not mounted (hereinafter referred to as a DRAM unmounted type). The result shown in FIG. 8 was obtained by using the same gate-electrode forming process in the fabrication of each of the DRAM mounted type and the DRAM unmounted type. Each of the CD losses was calculated by subtracting the size of the completed gate electrode from the size of the resist pattern prior to etching.

As shown in FIG. 8, mask-pattern-layout dependency is observed in pattern size though the same gate-electrode forming process was used to fabricate each of the types.

This indicates that, in accordance with the conventional method for fabricating a semiconductor integrated circuit device, the gate electrode size varies with difference in mask pattern layout associated with different types of semiconductor integrated circuit devices even if the same gate-electrode forming process is used. In other words, type dependency occurs in gate electrode size. As a result, the characteristics of a MOS transistor deviate from design specifications in a specified type of semiconductor integrated circuit device fabricated by using a specified mask, which causes the problem of a narrower operating margin. The problem cannot be ignored especially when the design rules are 0.18 μm or less.

SUMMARY OF THE INVENTION

In view of the foregoing, it is therefore an object of the present invention to prevent a size variation resulting from difference in mask pattern layout during the formation of a linear pattern composed of the gate electrode and wires of a MOS transistor, or metal wires, and the like.

To attain the object the present inventors have examined the cause of size variations resulting from difference in mask pattern layout.

As a result the examination, the present inventors have found that, in a semiconductor integrated circuit device on which a logic circuit composed of a CMOS (Complementary Metal-Oxide Semiconductor) is mounted and a memory circuit such as a DRAM composed of the gate electrode and wires that are densely arranged is mounted, pattern size varies with the area-occupying rate of the memory circuit.

The present inventors have also found that the phenomenon in which size variations result from difference in mask pattern layout is different in nature from the foregoing loading effect which results from the size of the etched area, i.e., the area of the pattern. As is obvious from FIG. 8, the phenomenon is a phenomenon of novel nature in which the pattern size varies over the entire chip, which is also different from the microloading effect resulting from the in-chip local denseness and sparseness of the pattern.

As described above, the type dependency of the size of the formed gate electrode or the like results from the CD loss. On the other hand, a dry etching step currently performed uses an etching gas having a sidewall protecting effect (hereinafter referred to as a deposition gas) or forms an etching reaction product having the sidewall protecting effect to achieve anisotropic dry etching by preventing side etching. If a gate electrode is formed by performing dry etching with respect to a polysilicon film, a chlorine-containing gas, e.g., is used frequently as the etching gas and HBr gas is used frequently as the deposition gas. As a result, a sidewall protecting film composed of $SiBr_4$, which is a reaction product between HBr and polysilicon and has low volatility, is formed on a sidewall of the polysilicon film. In the case of forming aluminium wires by performing dry etching with respect to an aluminium film, a $CHF_3$ gas has been used frequently as the deposition gas in recent years. The $CHF_3$ gas containing fluorine is a depositive gas added to form the sidewall protecting film but does not contribute to the etching of the aluminium film.

The present inventors have found that, if the configuration of the target film after etching is to be controlled with the sidewall protecting effect in the case of using the same gate-electrode forming process irrespective of the mask pattern layout, the sidewall protecting effect per unit area is reduced as the area of the sidewall of the target film to be protected increases, which increases the CD loss.

FIG. 9 shows the relationship between the perimeter of a gate electrode per unit area (the length of the peripheral portion of the gate electrode) and the DRAM area-occupying rate in each of various types of semiconductor integrated circuit devices having different DRAM area-occupying rates including the DRAM unmounted type. In the graph of FIG. 9, "Perimeter of Gate Electrode Per Unit Area" represented by the vertical axis indicates the value obtained by dividing the total perimeter of the gate electrodes in a specified circuit region by the area of the specified circuit region. The specified circuit region may be the entire chip.

As shown in FIG. 9, the perimeter of the gate electrode per unit area increases as the DRAM area-occupying rate increases.

FIG. 10 shows the relationship between the perimeter of the gate electrode per unit area and the CD loss in each of the various types.

As shown in FIG. 10, the size of the gate electrode decreases as the perimeter of the gate electrode per unit area increases (the CD loss becomes positive). Conversely, the size of the gate electrode increases as the perimeter of the gate electrode per unit area decreases (the CD loss becomes negative). This is because the area of the sidewall to be protected increases as the perimeter of the gate electrode per unit area increases so that the sidewall protecting effect per unit area is reduced accordingly.

The present inventors have focused attention on the fact that the CD loss changes monotonously from a negative value to a positive value as the perimeter of the gate electrode per unit area increases (see FIG. 10) and found that size variations in gate electrode pattern resulting from difference in mask pattern layout can be prevented by setting the perimeter of the gate electrode per unit area in a specified range irrespective of the type or adjusting a process condition in accordance with type-to-type difference in the perimeter per unit area of the gate electrode.

Specifically, a first semiconductor integrated circuit device according to the present invention assumes a semiconductor integrated circuit device comprising: a circuit pattern having a linear pattern, a perimeter of the linear pattern per unit area being set in a specified range.

In the first semiconductor integrated circuit device, the perimeter of the linear pattern per unit area is set in the specified range. Accordingly, even if a mask pattern layout differs greatly from one type of semiconductor integrated circuit device to another, size variations in linear pattern resulting from difference in mask pattern layout can be prevented. In a system LSI in which the mounting rate of DRAMs or the like is different depending on use or specifications also, it is possible to form gate electrode patterns, metal wires, or the like of uniform sizes irrespective of the mask pattern layout, so that a semiconductor integrated circuit device free of variations in operating margin is provided.

A second semiconductor integrated circuit device according to the present invention assumes a semiconductor integrated circuit device comprising: a circuit pattern having a linear pattern, a dummy pattern being inserted in a region in which the circuit pattern is placed such that a sum perimeter of the linear pattern and the dummy pattern per unit area is set in a specified range.

In the second semiconductor integrated circuit device, the sum perimeter of the linear pattern and the dummy pattern per unit area is set in the specified range. Accordingly, even if a mask pattern layout differs greatly from one type of semiconductor integrated circuit device to another, size variations in linear pattern resulting from difference in mask pattern layout can be prevented. In a system LSI in which the mounting rate of DRAMs or the like is different depending on use or specifications also, it is possible to form gate electrode patterns, metal wires, or the like of uniform sizes irrespective of the mask pattern layout, so that a semiconductor integrated circuit device free of variations in operating margin is provided.

In the second semiconductor integrated circuit device, the dummy pattern preferably has a strip-like configuration.

This allows easy formation of the dummy pattern.

A third semiconductor integrated circuit device according to the present invention assumes a semiconductor integrated circuit device comprising: a first circuit pattern having a first linear pattern and placed in a region in which a group of elements having a repetitive pattern are formed; and a second circuit pattern having a second linear pattern and placed in a region in which components other than the group of elements are formed, a dummy pattern being inserted in the region in which the second circuit pattern is placed such that a sum perimeter of the first linear pattern, the second linear pattern, and the dummy pattern per unit area is equal to or less than a perimeter of the first linear pattern per unit area.

In the third semiconductor integrated circuit device, the dummy pattern is inserted in the region in which the second circuit pattern corresponding to the components other than the group of elements is placed, whereby the sum perimeter per unit area of the first linear pattern of the first circuit pattern corresponding to the group of elements, the second linear pattern of the second circuit pattern, and the dummy pattern is set to the perimeter of the first linear pattern per unit area, i.e., the largest perimeter per unit area or less. Specifically, the sum perimeter per unit area is preferably set to 70% to 100% of the perimeter per unit area of the first linear pattern. Since the sum perimeter per unit area is set in the specified range, even if a mask pattern layout differs greatly from one type of semiconductor integrated circuit device to another, size variations in linear pattern resulting from difference in mask pattern layout can be prevented. In a system LSI in which the mounting rate of DRAMs or the like is different depending on use or specifications also, it is possible to form gate electrode patterns, metal wires, or the like of uniform sizes irrespective of the mask pattern layout, so that a semiconductor integrated circuit device free of variations in operating margin is provided.

In the third the semiconductor integrated circuit, the group of elements are preferably memories.

In the third the semiconductor integrated circuit, a perimeter of the dummy pattern per unit area is preferably 70% or more of the perimeter of the first linear pattern per unit area.

The insertion of the dummy pattern ensures the setting of the sum perimeter per unit area in the specified range, specifically 70% to 100% of the perimeter of the first linear pattern per unit area.

A first method for fabricating a semiconductor integrated circuit device assumes a method for fabricating a plurality of semiconductor integrated circuit devices each comprising a circuit pattern having a linear pattern, at least one of fabrication steps for the semiconductor integrated circuit devices being common, the fabrication steps including the step of: inserting a dummy pattern in a region in which the circuit pattern is placed such that a sum perimeter of the linear pattern and the dummy pattern per unit area is set in a specified range.

In accordance with the first method for fabricating a semiconductor integrated circuit device, the dummy pattern is inserted such that the sum perimeter of the linear pattern and the dummy pattern per unit area is set in the specified range. Specifically, it is desirable to assume, as the specified range, 70% to 100% of the perimeter of the linear pattern per unit area in a memory circuit. To satisfy the standard, the perimeter of the inserted dummy pattern per unit area should be 70% or more of the perimeter of the linear pattern per unit area in the memory circuit. The present inventors have found that the CD loss in the formed pattern or the size of the formed pattern changes depending on the perimeter of the formed pattern per unit area. Accordingly, even if a mask pattern layout differs greatly from one type of semiconductor integrated circuit device to another, the sum perimeter of the linear pattern and the dummy pattern per unit area can be set in the specified range by forming an additional dummy pattern having a perimeter per unit area of 70% or more of that of the linear pattern of the memory circuit in a vacant region. For example, the perimeter of the gate electrode per unit area over the entire chip is largely dependent on a specified circuit such as a memory circuit since the specified circuit has a large perimeter of the gate electrode per unit area. Even if the in-chip area-occupying rate of such a specified circuit varies from one type to another, variations in the perimeter of the gate electrode per unit area over the entire chip can be suppressed by using the dummy pattern, as described above. As a result, size variations resulting from difference in mask pattern layout can be prevented. In short, the linear pattern can constantly be formed by etching with high precision. In a system LSI in which the mounting rate of DRAMs, SRAMs, ROMS, or the like is different depending on use or specifications also, it is possible to form the gate electrode and wires for MOS transistors, metal wires, or the like of uniform sizes irrespective of the mask pattern layout, so that a semiconductor integrated circuit device free of variations in operating margin is provided.

A second method for fabricating a semiconductor integrated circuit device assumes a method for fabricating a semiconductor integrated circuit device, the method comprising the steps of: exposing each of a plurality of first regions of a semiconductor substrate to transfer a circuit pattern having a linear pattern onto the first region; exposing each of a plurality of second regions of the semiconductor substrate other than the first regions to transfer a dummy pattern onto the second region; and adjusting a ratio between the number of exposing shots for transferring the circuit pattern and the number of exposing shots for transferring the dummy pattern such that a sum perimeter of all the linear patterns transferred and all the dummy patterns transferred per unit area is set in a specified range.

In accordance with the second method for fabricating a semiconductor integrated circuit device, the ratio between the number of exposing shots for transferring the circuit pattern and the number of exposing shots for transferring the dummy pattern is adjusted such that the sum perimeter of all the linear patterns transferred and all the dummy patterns transferred per unit area is set in the specified range. Accordingly, even if a mask pattern layout differs greatly from one type of semiconductor integrated circuit device to another, size variations in linear pattern resulting from difference in mask pattern layout can be prevented. In a system LSI in which the mounting rate of DRAMs or the like is different depending on use or specifications also, it is possible to form gate electrode patterns, metal wires, or the like of uniform sizes irrespective of the mask pattern layout, so that a semiconductor integrated circuit device free of variations in operating margin is provided.

A third method for fabricating a semiconductor integrated circuit devices assumes a method for fabricating a plurality of semiconductor integrated circuit devices each comprising a circuit pattern having a linear pattern, at least one of fabrication steps for the semiconductor integrated circuit devices being common, the fabrication steps including the step of: performing dry etching with respect to a target film while adjusting a dry etching condition in accordance with a perimeter of the linear pattern per unit area.

In accordance with the third method for fabricating a semiconductor integrated circuit device, dry etching is performed with respect to the target film while adjusting the dry etching condition in accordance with the perimeter of the linear pattern per unit area. Accordingly, even if a mask pattern layout differs greatly from one type of semiconductor integrated circuit device to another, the size of the linear pattern can be held constantly at a specified value. In a system LSI in which the mounting rate of DRAMs or the like is different depending on use or specifications also, it is possible to form gate electrode patterns, metal wires, or the like of uniform sizes irrespective of the mask pattern layout, so that a semiconductor integrated circuit device free of variations in operating margin is provided.

In the third method for fabricating a semiconductor integrated circuit device, the step of adjusting the dry etching condition preferably includes the step of: determining one dry etching condition when the perimeter of the linear pattern per unit area is within one range.

The arrangement allows easy adjustment of the dry etching condition.

A fourth method for fabricating a semiconductor integrated circuit device assumes a method for fabricating a plurality of semiconductor integrated circuit devices each comprising a circuit pattern having a linear pattern, at least one of fabrication steps for the semiconductor integrated circuit devices being common, the fabrication steps including the step of: forming a resist pattern corresponding to the linear pattern while adjusting a size of the resist pattern in accordance with a perimeter of the linear pattern per unit area.

In accordance with the fourth method for fabricating a semiconductor integrated circuit device, the resist pattern corresponding to the linear pattern is formed while the size of the resist pattern is adjusted in accordance with the perimeter of the linear pattern per unit area. Accordingly, even if a mask pattern layout differs greatly from one type of semiconductor integrated circuit device to another, the size of the linear pattern can be held constantly at a specified value. In a system LSI in which the mounting rate of DRAMs or the like is different depending on use or specifications also, it is possible to form gate electrode patterns, metal wires, or the like of uniform sizes irrespective of the mask pattern layout, so that a semiconductor integrated circuit device free of variations in operating margin is provided.

A fifth method for fabricating a semiconductor integrated circuit devices assumes a method for fabricating a plurality of semiconductor integrated circuit devices each comprising a circuit pattern having a linear pattern, at least one of fabrication steps for the semiconductor integrated circuit devices being common, the fabrication steps including: a first step of forming a resist pattern corresponding to the linear pattern on a target film; and a second step of performing dry etching with respect to the target film by using the resist pattern as a mask, the second step including the step of: using an etching gas having an effect of protecting a sidewall formed in the target film through the etching or forming an etching reaction product having the sidewall protecting effect, a processing method or a processing condition in at least one of the first and second steps being adjusted in accordance with a ratio between an area occupied by a group of elements contained in the circuit pattern and having a repetitive pattern and an area of a region in which the circuit pattern is placed.

In the first step of forming the resist pattern corresponding to the linear pattern or in the second step of performing dry etching with respect to the target film by using the resist pattern as a mask, the fifth method for fabricating a semiconductor integrated circuit device changes the processing method or the processing condition in accordance with the rate of the area occupied by the group of elements having the repetitive pattern to the area of the region in which the circuit pattern is placed (hereinafter referred to as a group-of-elements area-occupying rate). Accordingly, even if the area of the sidewall formed in the target film through etching differs according to difference in group-of-elements area-occupying rates, i.e., difference in mask pattern layout, it is possible to adjust the size of the resist pattern in the first step so as to eliminate difference in sidewall protecting effects per unit area in the second step or adjust the etching condition in the second step to achieve a desired sidewall protecting effect per unit area. This prevents size variations resulting from difference in mask pattern layout during the formation of the circuit pattern by using a lithographic or dry etching technique and thereby allows high-precision formation of a gate electrode or wires.

In the fifth method for fabricating a semiconductor integrated circuit device, the group of elements are preferably memories such as DRAMs.

In the fifth method for fabricating a semiconductor integrated circuit device, the first step preferably includes the step of: increasing a size of the resist pattern as the group-of-elements area-occupying rate increases.

In the arrangement, the area of the sidewall formed in the target film through etching increases as the group-of-elements area-occupying rate increases. Accordingly, even if the sidewall protecting effect per unit area decreases in the second step, the decrement in sidewall protecting effect can be compensated for so that size variations in components are surely suppressed.

In the fifth method for fabricating a semiconductor integrated circuit device, the second step preferably includes the step of: determining an etching condition such that the sidewall protecting effect increases as the group-of-elements area occupying rate increases.

In the arrangement, even if the area of the sidewall formed in the target film through etching increases as the group-of-elements area-occupying rate increases, a desired sidewall protecting effect per unit area is achievable in the second step that so that size variations in components are surely suppressed.

DETAILED DESCRIPTION OF THE INVENTION

Embodiment 1

A semiconductor integrated circuit device and a method for fabricating the same according to a first embodiment of the present invention will be described with reference to the drawings. It is to be noted that the method for fabricating the semiconductor integrated circuit device according to the first embodiment assumes a method for fabricating a plurality of semiconductor integrated circuit devices each comprising a circuit pattern having a linear pattern and at least one of fabrication process steps for the semiconductor integrated circuit devices is common.

The first embodiment features a dummy pattern inserted in a region in which a circuit pattern having a linear pattern is to be placed such that a sum perimeter of the linear pattern and the dummy pattern per unit area is set in a specified range.

Figure 1:
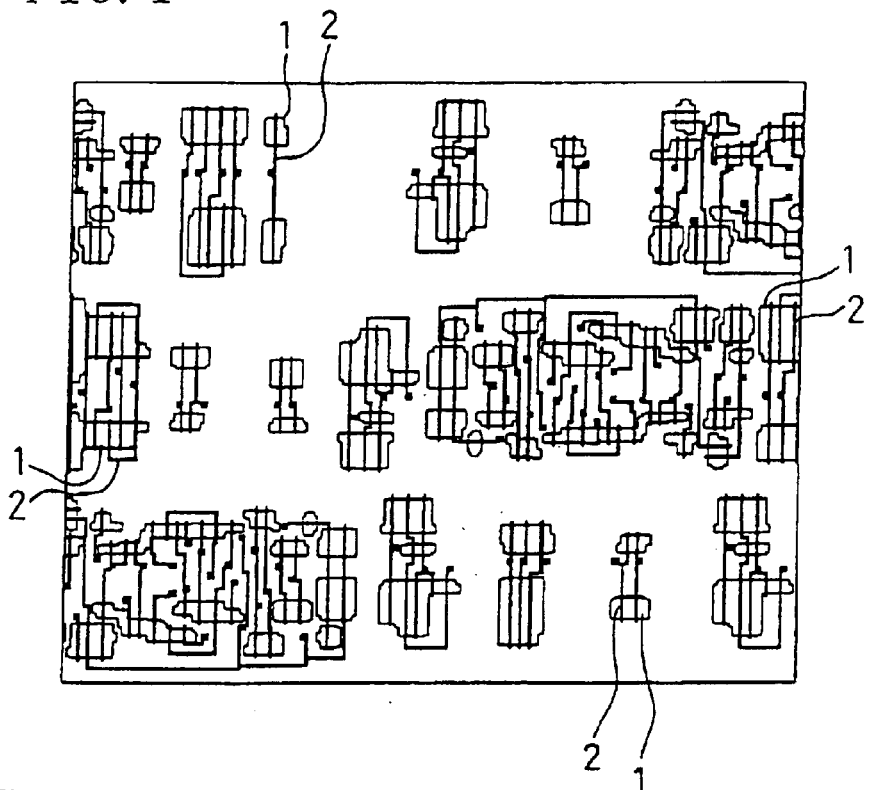
FIG. 1 shows an example of the layout of a circuit pattern prior to the insertion of a dummy pattern in a semiconductor integrated circuit device according to a first embodiment of the present invention.
Figure 2:
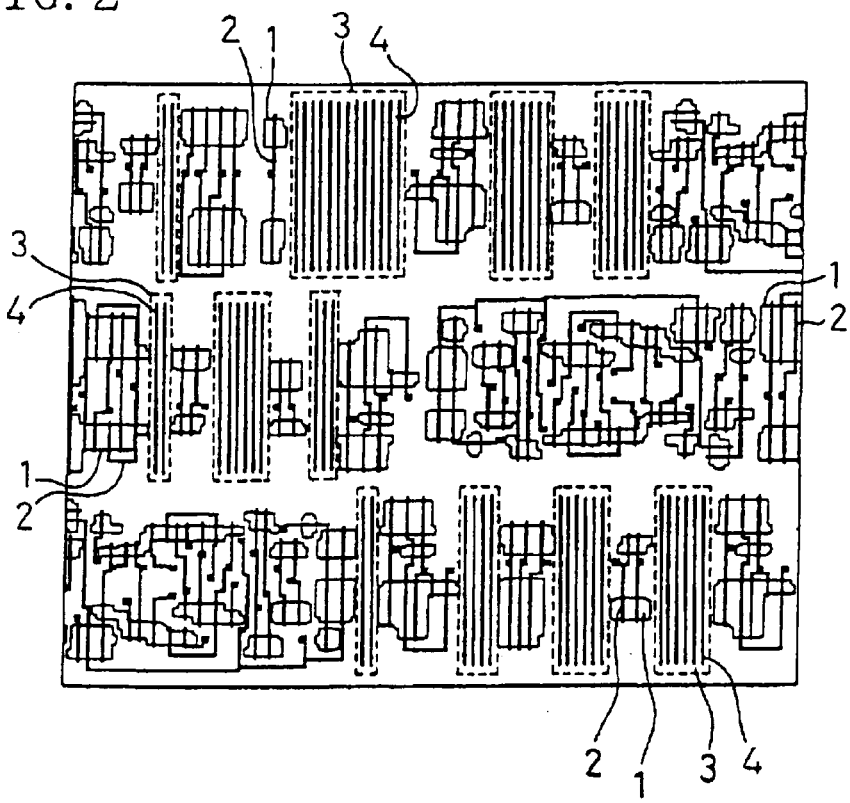
FIG. 2 shows an example of the layout of a circuit pattern after the insertion of the dummy pattern in the semiconductor integrated circuit device according to the first embodiment.

FIG. 1 shows an example of the layout of the circuit pattern prior to the insertion of the dummy pattern in the semiconductor integrated circuit device according to the first embodiment. FIG. 2 shows an example of the layout of the circuit pattern after the insertion of the dummy pattern in the semiconductor integrated circuit device according to the first embodiment. Although the circuit pattern shown in each of FIGS. 1 and 2 is of a logic circuit, a memory circuit such as a RAM or ROM may also be mounted on a chip in addition to the logic circuit.

As shown in FIG. 1, the circuit pattern is composed of an active region pattern 1 and a gate electrode pattern 2 for a MOS transistor. As shown in FIG. 2, a strip-like or linear gate electrode dummy pattern 4 is inserted in a vacant region 3 in which the active region pattern 1 and the gate electrode pattern 2 are not provided.

This allows an increase in the perimeter of the gate electrode without increasing the chip area. Specifically, the perimeter of the gate electrodes per unit area in the circuit pattern after the insertion of the dummy pattern shown in FIG. 2 has increased to 1600 mm/mm$^2$, in contrast to the circuit pattern before the insertion of the dummy pattern shown in FIG. 1 in which the perimeter of the gate electrode per unit area is 500 mm/mm$^2$. Thus, in the first embodiment, the perimeter of the gate electrode per unit area was as small as 500 mm/mm$^2$ at a time prior to the insertion of the dummy patterns due to a low area-occupying rate of DRAMs, ROMs, or the like where the gate electrode patterns are dense (or due to the fact that the DRAMs, ROMs, or the like are not mounted). To bring the perimeter of the gate electrode per unit area of each of the gate electrode patterns 2 in the circuit pattern shown in FIG. 1 closer to the perimeter of the gate electrode per unit area in another type with a higher mounting rate of DRAMs or ROMs, therefore, a large number of gate electrode dummy patterns 4 are inserted such that a sum perimeter of the gate electrode patterns 2 and the gate electrode dummy patterns 4 per unit area is greatly increased to 1600 mm/mm$^2$, as shown in FIG. 2.

Figure 10:
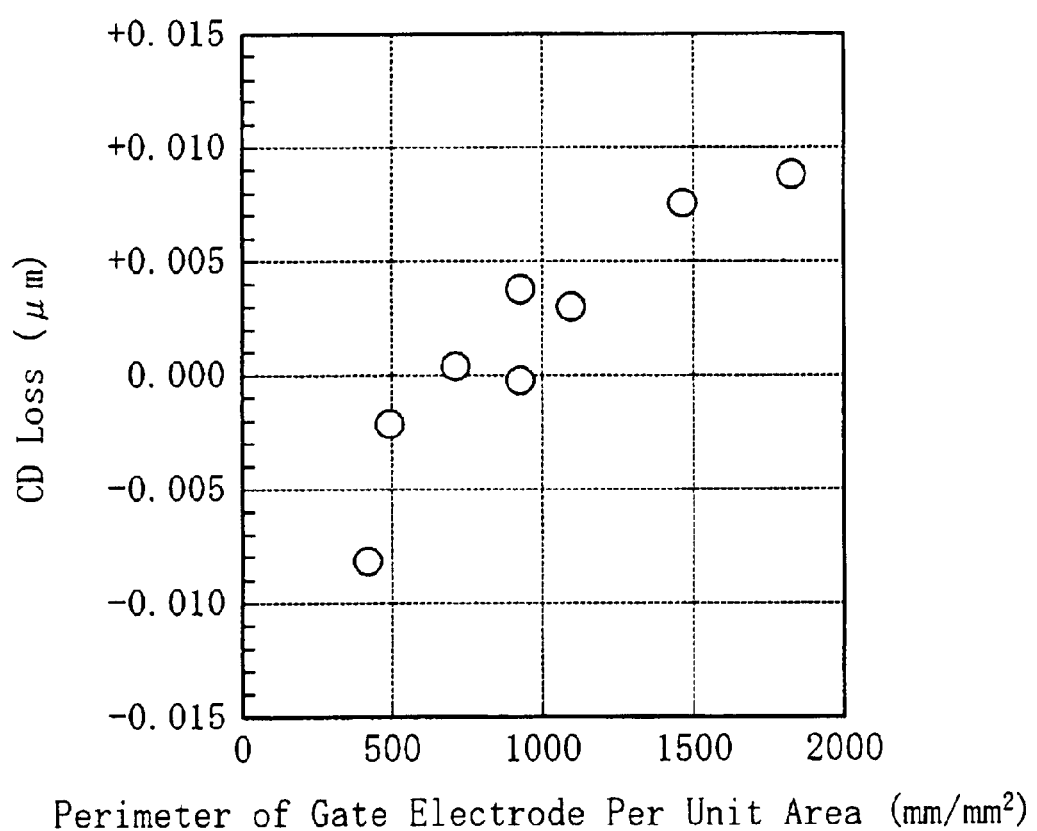
FIG. 10 shows the relationship between the perimeter of gate electrodes per unit area and a CD loss in each of the various types.

To reduce variations in CD loss resulting from type-to-type difference in the perimeter of the gate electrode per unit area in the gate-electrode forming process (specifically in etching for forming the gate electrode) to an error range of 0 to 0.003 μm associated with size measurement, reticle formation, or the like, the type-to-type difference in the perimeter of the gate electrode per unit area should be limited to a range of about 500 mm/mm$^2$ (see FIG. 10).

In a system LSI, on the other hand, the mounting rate of DRAMs, ROMS, or the like where the gate electrode patterns are dense differs greatly from one type to another so that the perimeter of the gate electrode per unit area varies significantly. The perimeter of the gate electrode per unit area is maximum in general-purpose DRAMs having DRAM cells where the gate electrode patterns are densest, the value of which is about 2500 mm/mm$^2$.

To reduce the type-to-type difference in the perimeter of the gate electrode per unit area to about 500 mm/mm$^2$, therefore, the standard (the foregoing specified range) may be set in about 2000 to 2500 mm/mm$^2$. However, there is a case where a type exists in which a dummy pattern cannot be inserted such that the required perimeter of the gate electrode per unit area, which is 2000 mm/mm$^2$, is satisfied depending on the layout prior to the insertion of the dummy pattern. In reality, it can be assumed that a system LSI on which DRAMs having an area-occupying rate of 70% or more are mounted will not be produced. Therefore, the present embodiment has determined 2000 mm/mm$^2$ which corresponds to the case where the DRAM area-occupying rate is 80% as the upper limit of the standard range of the perimeter of the gate electrode per unit area and determined 1600 to 2000 mm/mm$^2$ as the standard range of the perimeter of the gate electrode per unit area.

According to the first embodiment, a perimeter of the gate electrodes per unit area over the entire chip, i.e., a sum perimeter of the gate electrode patterns 2 and the gate electrode dummy patterns 4 per unit area (if a memory circuit not shown is mounted, a sum perimeter of the gate electrodes per unit area considering another gate electrode pattern included in the memory circuit) can be set in a specified range with the insertion of the gate electrode dummy patterns 4. Specifically, it is desirable to assume, as the specified range, 70% to 100% of the perimeter of the gate electrode per unit area in the memory circuit, i.e., the maximum perimeter per unit area. To satisfy the standard, the perimeter per unit area of the gate electrode dummy patterns 4 to be inserted (a value obtained by, e.g., dividing the perimeter of the gate electrode dummy patterns 4 by the area of the vacant regions 3) should be 70% or more of the perimeter of the gate electrode per unit area in the memory circuit. The arrangement ensures the setting of a perimeter of the gate electrode per unit area over the entire chip in the specified range even if the mask pattern layout differs greatly from one type of semiconductor integrated circuit device to another. For example, a perimeter of the gate electrode per unit area over the entire chip is greatly dependent on a specified circuit such as a memory circuit because of its large perimeter of the gate electrode per unit area. Even when the in-chip area-occupying rate of the specified circuit varies from one type to another, variations in the perimeter of the gate electrodes per unit area over the entire chip can be suppressed by using the dummy patterns, as described above. As a result, size variations resulting from difference in mask pattern layout can be prevented. In short, it becomes possible to form the gate electrode patterns 2 of constantly uniform sizes through etching. In a system LSI in which the mounting rate of DRAMs or the like is different depending on use or specifications also, it is possible to form the gate electrode patterns 2 of uniform sizes irrespective of the mask pattern layout, so that a semiconductor integrated circuit device free of variations in operating margin is provided.

In the first embodiment, the method of forming the gate electrode patterns 2 is not particularly limited. The gate electrode patterns 2 may also be formed by using, e.g., a parallel-plate RIE (Reactive Ion Etching) apparatus and setting the flow rate of a $Cl_2$ gas to 0.04 SLM (Standard Litter per Minute), the flow rate of HBr gas to 0.08 SLM, pressure to 20 Pa, and RF power to 300 W, which are main dry etching conditions, and performing etching with respect to the polysilicon film.

In the first embodiment, the perimeter per unit area of the linear pattern (for example, the gate electrode pattern) composing the circuit pattern may also be set in a specified range without using the dummy pattern.

Although the first embodiment has assumed the formation of the gate electrode, the present invention is not limited thereto. The present invention achieves equally high formation accuracy even in the microfabrication of a layer having another linear pattern, e.g., the formation of metal wires composed of, e.g., aluminium, copper, or the like.

Embodiment 2

A semiconductor integrated circuit device and a method for fabricating the same according to a second embodiment of the present invention will be described with reference to the drawings. It is to be noted that the method for fabricating the semiconductor integrated circuit device according to the second embodiment assumes a method for fabricating a plurality of semiconductor integrated circuit devices each comprising a circuit pattern having a linear pattern and at least one of fabrication process steps for the semiconductor integrated circuit devices is common.

The second embodiment features the adjustment of a ratio between the number of exposing shots for transferring the circuit pattern having a linear pattern onto a wafer as a substrate to be exposed and the number of exposing shots for transferring a dummy pattern onto the wafer such that a sum perimeter of all linear patterns transferred and all dummy patterns transferred per unit area is set in a specified range.

Figure 3A:
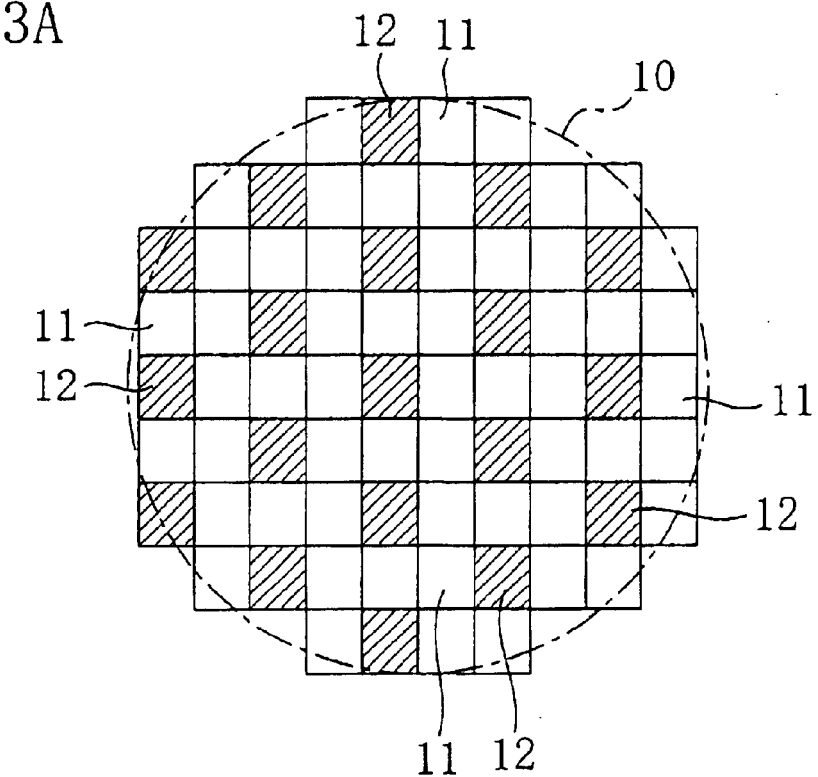
FIG. 3A shows an example of a pattern-exposure shot map in a lithographic step for forming a polysilicon gate electrode pattern in accordance with a method for fabricating a semiconductor integrated circuit device according to a second embodiment of the present invention and FIG. 3B shows an example of a dummy pattern used in the lithographic step.
Figure 3B:
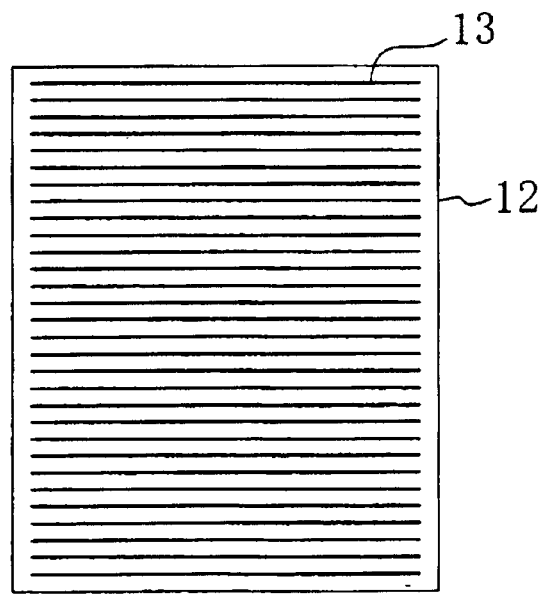

FIG. 3A shows an example of a pattern-exposure shot map in a lithographic step for forming a polysilicon gate electrode pattern in the method for fabricating the semiconductor integrated circuit devices according to the second embodiment. FIG. 3B shows an example of a dummy pattern used in the lithographic step.

In the method for fabricating the semiconductor integrated circuit devices according to the second embodiment, the number of first exposed regions 11 on each of which the circuit pattern is transferred (i.e., the number of exposing shots for transferring the circuit pattern) and the number of second exposed regions 12 on each of which the dummy pattern is transferred (i.e., the number of exposing shots for transferring the dummy pattern) are adjusted on a wafer 10, as shown in FIG. 3A. Onto each of the second exposed regions 12, a strip-like dummy pattern 13 composed of e.g., 0.2-$\mu$m lines and 0.2-$\mu$m spaces is transferred simply and entirely over the second exposed region 12.

As a result, it becomes possible to limit, e.g., the perimeter of the gate electrodes per unit area over the wafer 10, i.e., a sum perimeter of all gate electrode patterns transferred (included in all circuit patterns transferred) and all dummy patterns 13 transferred per unit area to a specified range which is not dependent on the mask pattern layout of the semiconductor integrated circuit device, i.e., on the mask pattern layout corresponding to the circuit pattern.

Specifically, the present embodiment uses a dummy reticle mask for transferring the dummy pattern 13 in addition to a reticle mask for forming the circuit pattern. This allows the perimeter of the gate electrode per unit area over the entire wafer 10 to be larger than in the first embodiment.

To limit the perimeter of the gate electrode per unit area over the entire wafer 10 to the range of, e.g., 1600 to 2000 mm/mm$^2$, similarly to the first embodiment, the present embodiment can calculate the rate A of the area occupied by the second exposed regions 12 to the area of the entire wafer as follows. In this case, it is assumed that the perimeter per unit area of the dummy pattern to be transferred onto each of the second exposed regions 12 is, e.g., 5000 mm/mm$^2$ and the perimeter of the gate electrode per unit area in the circuit pattern to be transferred onto each of the first exposed regions 12 is, e.g., 500 mm/mm$^2$. That is, the relation represented by the following expression:

$$1600 \leq 5000 \times A + 500 \times (1-A) \leq 2000$$

is established so that $$0.244 \leq A \leq 0.333$$

is satisfied. This causes the necessity to set the number of exposing shots for transferring the dummy pattern such that the rate of the area occupied by the second exposing regions 12 to the area of the entire wafer 10 is about 24.5% or more. Specifically, as shown in FIG. 3A, the first exposed regions 11 for transferring the circuit pattern are provided to occupy ¾ (75%) of the surface area of the wafer 10 and the second exposed regions 12 for transferring the dummy pattern are provided to occupy ¼ (25%) of the surface area of the wafer 10 in the present embodiment.

According to the second embodiment, the ratio between the number of exposing shots for transferring the circuit pattern and the number of exposing shots for transferring the dummy pattern is adjusted such that the perimeter of the gate electrode per unit area over the entire wafer 10 is set in a specified range. This prevents size variations in gate electrode pattern resulting from difference in mask pattern layout even if the mask pattern layout differs greatly from one type of semiconductor integrated circuit device to another. In a system LSI in which the mounting rate of DRAMs or the like is different depending on use or specifications also, it is possible to form gate electrode patterns of uniform sizes irrespective of the mask pattern layout, so that a semiconductor integrated circuit device free of variations in operating margin is provided.

In the second embodiment, the perimeter of the dummy pattern per unit area is preferably 70% or more of the perimeter of the gate electrode per unit area in a memory circuit mounted on the semiconductor integrated circuit device.

In the second embodiment, the ratio between the number of exposing shots for transferring the circuit pattern and the number of exposing shots for transferring the dummy pattern is adjusted preferably such that the perimeter of the gate electrode per unit area over the entire wafer is set to 70% to 100% of the perimeter of the gate electrode per unit area in the memory circuit.

Although the second embodiment has assumed the formation of the gate electrode, the present invention is not limited thereto. The present invention achieves equally high formation accuracy even in the microfabrication of a layer having another linear pattern, e.g., the formation of metal wires composed of, e.g., aluminium, copper, or the like.

Embodiment 3

A semiconductor integrated circuit device and a method for fabricating the same according to a third embodiment of the present invention will be described with reference to the drawings. It is to be noted that the method for fabricating the semiconductor integrated circuit device according to the third embodiment assumes a method for fabricating a plurality of semiconductor integrated circuit devices each comprising a circuit pattern having a linear pattern and at least one of fabrication process steps for the semiconductor integrated circuit devices is common.

The third embodiment features dry etching performed with respect to a target film while a dry etching condition is adjusted in accordance with the perimeter per unit area of the linear pattern composing a circuit pattern. By way of example, a description will be given herein below to the case where the size dependency of a gate electrode pattern on a mask pattern layout for the semiconductor integrated circuit device is suppressed by selectively using a dry etching condition for forming the gate electrode pattern.

Figure 4:
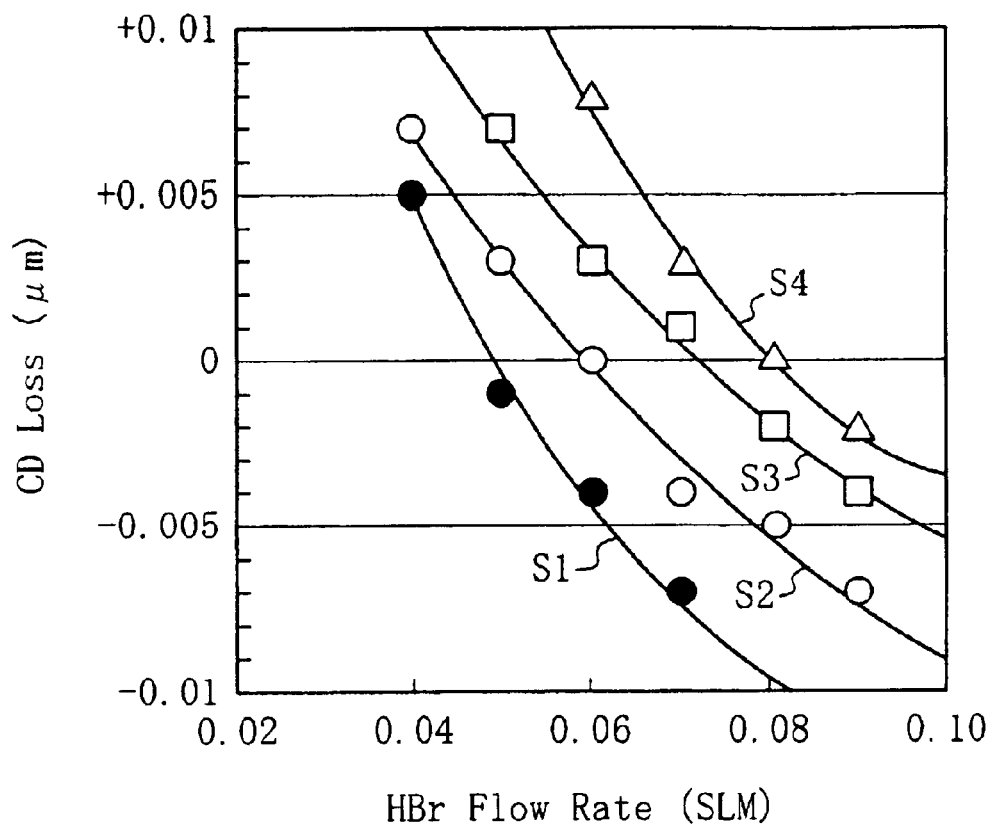
FIG. 4 shows the result of experimentally determining the relationship between the flow rate of a dry etching gas and a CD loss in a polysilicon gate electrode pattern by using, as a parameter, an on-chip perimeter of gate electrodes per unit area when the gate electrode pattern is formed by dry etching in the fabrication of plural types of semiconductor integrated circuit devices.

FIG. 4 is a graph showing, when a polysilicon gate electrode pattern is formed by dry etching in the fabrication of plural types of semiconductor integrated circuit devices incorporating circuits of various layouts, the result of experimentally determining the relationship between the flow rate of a dry etching gas and a CD loss in a gate electrode pattern by using a perimeter of the gate electrode per unit area over a chip as parameters (parameter S1: 600 mm/mm$^2$, parameter S2: 1000 mm/mm$^2$, parameter S3: 1400 mm/mm$^2$, and parameter S4: 1800 mm/mm$^2$). The experimental result shown in FIG. 4 was obtained by using, as an etching gas, a gas mixture of HBr, $Cl_2$, and He serving as a cooling gas and varying the gas flow rate of HBr composing the gas mixture.

As shown in FIG. 4, even though the gas flow rate of HBr is the same, if the perimeter of the gate electrode per unit area differs, the CD loss in the gate electrode pattern differs accordingly. On the other hand, by varying the gas flow rate of HBr, the CD loss can be reduced to nearly zero at a specified flow rate even at any value of the perimeter of the gate electrode per unit area.

Thus, the method for fabricating the semiconductor integrated circuit devices according to the third embodiment preliminarily calculates the perimeter of the gate electrode per unit area in a circuit pattern for each of the semiconductor integrated circuit devices and experimentally determines the relationship between the dry etching condition and the CD loss shown in FIG. 4. Then, dry etching is performed with respect to the polysilicon film to be formed into the gate electrodes by selectively using such a dry etching condition (which is the flow rate of HBr gas in FIG. 4) that, for the calculated perimeter of the gate electrode per unit area, the CD loss in the gate electrode pattern becomes substantially zero to a degree that can be permitted in terms of design. In other words, dry etching is performed with respect to the polysilicon film by selectively using a dry etching condition such that the size of the gate electrode pattern equals an objective size determined at the design stage.

In the fabrication of plural types of semiconductor integrated circuit devices on which, e.g., a memory circuit and a logic circuit are mounted, if the objective size of the formed pattern is the same for each of the types but the layout differs greatly from one type to another, accurate etching for pattern formation can be performed in principle irrespective of the layout. In practice, however, it is not preferred to individually determine the dry etching condition for each of the types with different layouts, i.e., to vary the dry etching condition from one type to another in terms of mass producibility.

To prevent this, the present embodiment may also divide the perimeter of the gate electrode per unit area into a plurality of ranges and set one dry etching condition for the perimeter of the gate electrode per unit area in each of the ranges.

Table 1 shows an optimum condition in the dry etching step for the perimeter of the gate electrode per unit area in each of the ranges in forming the polysilicon gate electrode pattern by dry etching.

TABLE 1

| Perimeter of Gate Electrode Per Unit Area (mm/mm$^2$) | Recipe No. of Dry Etching Condition in Forming Gate Electrode Pattern | HBr Gas Flow Rate (SLM) |
|---|---|---|
| 400<S≦800 | PS1 | 0.05 |
| 800<S≦1200 | PS2 | 0.06 |
| 1200<S≦1600 | PS3 | 0.07 |
| 1600<S≦2000 | PS4 | 0.08 |

As shown in Table 1, the perimeter of the gate electrode per unit area is divided into a plurality of ranges such that dry etching conditions (specifically, the flow rates of HBr gas) different from one range to another are used. When the dry etching conditions shown in Table 1 are used, the CD loss in the gate electrode pattern for the perimeter of the gate electrode per unit area in each of the ranges (S1 to S4) is a small value substantially falling within 0±0.002 m, as is obvious from the correspondence with FIG. 4. This provides sufficient pattern accuracy even in the fabrication of a device with design rules of 0.1 μm or less.

Since the third embodiment performs dry etching with respect to the polysilicon film while adjusting a dry etching condition for the polysilicon film formed into the gate electrodes in accordance with the perimeter of the gate electrode per unit area, the size of the gate electrode pattern can constantly be adjusted to a specified value even if the mask pattern layout greatly differs from one type of semiconductor integrated circuit device to another. In a system LSI in which the mounting rate of DRAMs or the like is different depending on use or specifications also, it is possible to form gate electrode patterns of uniform sizes irrespective of the mask pattern layout, so that a semiconductor integrated circuit device free of variations in operating margin is provided.

Since the third embodiment has divided the perimeter of the gate electrode per unit area into the plurality of ranges and determined one dry etching condition for each of the ranges, the dry etching condition can be adjusted more easily than in the case where the dry etching condition is changed on a per type basis.

Although the third embodiment has controlled the CD loss in the gate electrode pattern by adjusting the flow rate of HBr gas in the dry etching step for forming the polysilicon gate electrode, it is also possible to determine the optimum dry etching condition by adjusting the total flow rate of all etching gases, the pressure of each etching gas, the RF power of a dry etching apparatus, or the like instead of adjusting the HBr flow rate.

In the third embodiment, if an organic coated film serving as a light-reflection preventing film in, e.g., a lithographic step is formed on the polysilicon film to be formed into the gate electrodes or if a silicon dioxide film or the like serving as a hard mask is formed by, e.g., CVD (Chemical Vapor Deposition) on the polysilicon film to be formed into the gate electrodes, the etching condition for the organic coated film, the CVD silicon oxide film, or the like may also be adjusted instead of adjusting the etching condition for the polysilicon film.

Although the third embodiment has assumed the formation of the gate electrode, the present invention is not limited thereto. The present invention achieves equally high formation accuracy even in the microfabrication of a layer having another linear pattern, e.g., etching for forming metal wires, etching of an insulating film for forming a trench for a buried wire, or the like.

Embodiment 4

A semiconductor integrated circuit device and a method for fabricating the same according to a fourth embodiment of the present invention will be described with reference to the drawings. It is to be noted that the method for fabricating the semiconductor integrated circuit device according to the fourth embodiment assumes a method for fabricating a plurality of semiconductor integrated circuit devices each comprising a circuit pattern having a linear pattern and at least one of fabrication process steps for the semiconductor integrated circuit devices is common.

The third embodiment has adjusted the dry etching condition in accordance with the perimeter per unit area of the linear pattern composing the circuit pattern. By contrast, the fourth embodiment features the formation of a resist pattern corresponding to the linear pattern composing the circuit pattern, while adjusting the size of the resist pattern in accordance with the perimeter of the linear pattern per unit area. By way of example, a description will be given herein below to the case where the size dependency of a gate electrode pattern on a mask pattern layout for the semiconductor integrated circuit device is suppressed by adjusting the size of the resist pattern corresponding to the gate electrode pattern.

Specifically, when a polysilicon gate electrode pattern is formed by dry etching in the fabrication of plural types of semiconductor integrated circuit devices incorporating circuits of various layouts, the fourth embodiment uses, as an etching gas, a gas mixture of HBr, $Cl_2$, and He serving as a cooling gas, while fixing the gas flow rate of HBr composing the gas mixture to 0.07 SLM. That is, the dry etching condition used in the fourth embodiment is fixed to the recipe No. PS3 (standard condition) shown in Table 1 of the third embodiment. When the dry etching condition is thus fixed, the value of the CD loss in the gate electrode pattern differs depending on the mask pattern layout, as shown in FIG. 4 of the third embodiment.

In the method for fabricating the semiconductor integrated circuit devices according to the fourth embodiment, therefore, the relationship between a perimeter of the gate electrode per unit area in a circuit pattern for each of the semiconductor integrated circuit devices and the CD loss in the gate electrode pattern is determined. Then, the size of the resist pattern serving as a dry etching mask is adjusted in accordance with, e.g., a photolithographic condition such as a dose such that a variation in pattern size which occurs depending on the magnitude of the determined CD loss, i.e., on the perimeter of the gate electrode per unit area is compensated for.

Table 2 shows the CD loss (A) in the gate electrode pattern, the objective size (B) in the photolithographic step, and the design size (C) of the gate electrode pattern after dry etching, which are for the perimeter of the gate electrode per unit area in each of the ranges in performing dry etching by forming the resist pattern corresponding to the polysilicon gate electrode pattern and performing the dry etching by using the formed resist pattern.

TABLE 2

| Perimeter of Gate Electrode Per Unit Area (mm/mm$^2$) | CD Loss (A) in Recipe No. PS3 ($\mu$m) | Objectve Size (B) in lithographic Step ($\mu$m) | Design Size (C) After Dry Etching ($\mu$m) |
| --- | --- | --- | --- |
| 400<S≦800 | −0.007 | 0.143 | 0.150 |
| 800<S≦1200 | −0.003 | 0.147 | 0.150 |
| 1200<S≦1600 | 0.001 | 0.151 | 0.150 |
| 1600<S≦2000 | 0.003 | 0.153 | 0.150 |

In Table 2, each CD loss (A) is a value obtained when the dry etching condition of the recipe No. PS3 shown in Table 1 is used. Each objective size (B) is the optimum size of the resist pattern adjusted in consideration of the magnitude of the CD loss (A), as described above. In the present embodiment, the design size (C) is determined to be 0.150 $\mu$m.

Since the relation given by the following expression:

$$\text{Objective Size } (B) = \text{CD Loss } (A) + \text{Design size } (C)$$

is established, the objective size (B), i.e., the value of the optimum size of the resist pattern shown in Table 2 can be determined specifically. Conversely, an amount of adjustment and the CD loss (A) can be cancelled out by adjusting the objective size (B) in the photolithographic step.

In the present embodiment, the objective size (B) in the photolithographic step can also be determined easily by reading the CD loss corresponding to the perimeter per unit area of the gate electrode in each of the ranges (S1 to S4) when the flow rate of HBr gas is, e.g., 0.07 SLM in FIG. 4 by focusing attention on the fact that the design size (C) is 0.150 $\mu$m and the dry etching condition is the Recipe No. PS3 (Flow Rate of HBr Gas: 0.07 SLM) shown in Table 1. The reason that the recipe No. PS3 shown in Table 1 is used as the dry etching condition in the present embodiment is as follows. As is obvious from Table 2, when the recipe No. PS3 is used, the amount of adjustment of the objective size (B) corresponding to the magnitude of the CD loss (A) becomes minimum with respect to various perimeters of the gate electrodes per unit area implemented in the different types of semiconductor integrated circuit devices.

Since the fourth embodiment has thus formed the resist pattern corresponding to the gate electrode pattern while adjusting the size of the resist pattern in accordance with the perimeter of the gate electrode per unit area, the size of the gate electrode pattern can constantly be adjusted to a specified value even if the mask pattern layout greatly differs from one type of semiconductor integrated circuit device to another. In a system LSI in which the mounting rate of DRAMs or the like is different depending on use or specifications also, it is possible to form gate electrode patterns of uniform sizes irrespective of the mask pattern layout, so that a semiconductor integrated circuit device free of variations in operating margin is provided.

To adjust the objective size in the photolithographic step, i.e., adjust the size of the resist pattern corresponding to the gate electrode pattern in the fourth embodiment, it is an easiest method to increase or decrease, e.g., a dose during the exposure of the resist pattern. It is also possible to correct the size of a light shielding pattern (e.g., a chrome pattern) on a photo mask or the like. This obviates the necessity to increase or decrease the dose and reduces the number of the fabrication steps.

Although the fourth embodiment has assumed the formation of the gate electrode, the present invention is not limited thereto. The present invention achieves equally high formation accuracy even in the microfabrication of a layer having another linear pattern, e.g., the formation of metal wires composed of, e.g., aluminium, copper, or the like.

Embodiment 5

A semiconductor integrated circuit device and a method for fabricating the same according to a fifth embodiment of the present invention will be described with reference to the drawings. It is to be noted that the method for fabricating the semiconductor integrated circuit device according to the fifth embodiment assumes a method for fabricating a plurality of semiconductor integrated circuit devices each comprising a circuit pattern having a linear pattern and at least one of fabrication process steps for the semiconductor integrated circuit devices is common. By way of example, a description will be given herein below to a method for forming gate electrodes in a system LSI in which memories such as DRAMs having a repetitive pattern can be merged.

FIGS. 5A to 5D are cross-sectional views illustrating the individual process steps of the method for fabricating the semiconductor integrated circuit device according to the fifth embodiment.

Figure 5A:
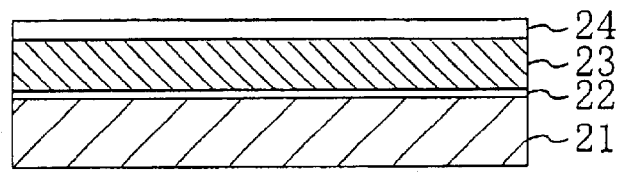
FIGS. 5A to 5D are cross-sectional views illustrating the individual steps of a method for fabricating a semiconductor integrated circuit device according to a fifth or sixth embodiment of the present invention.

First, as shown in FIG. 5A, a silicon oxide film 22 having a thickness of about 5 nm and serving as a gate insulating film is formed on a silicon substrate 21. Then, a polysilicon film 23 having a thickness of about 200 nm and serving as the gate electrodes is formed on the silicon oxide film 22. Thereafter, an organic coated film 24 having a thickness of about 100 nm and serving as a light-reflection preventing film in a lithographic step (see FIG. 5B) is formed on the polysilicon film 23.

Figure 5B:
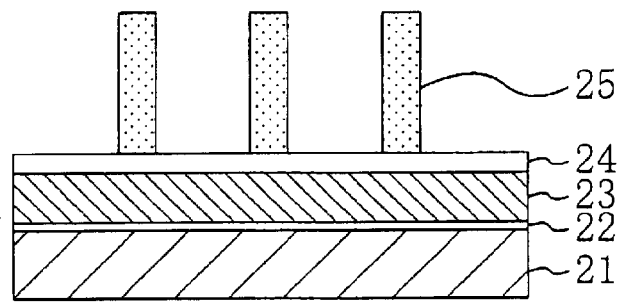

Next, as shown in FIG. 5B, a resist pattern 25 (with a thickness of about 600 nm) having a minimum line width (the objective size of the gate electrode) of 0.15 μm and corresponding to the gate electrodes 26 (see FIG. 5D) having a linear pattern is formed on the organic coated film 24 by using a lithographic technique.

Figure 5C:
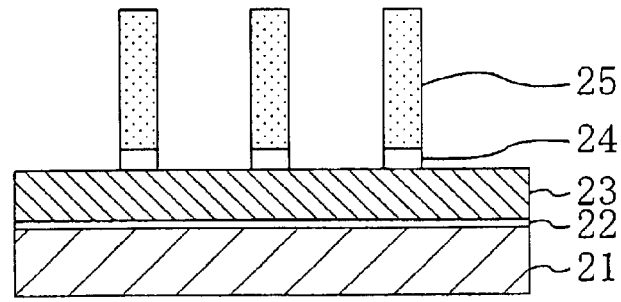

Next, as shown in FIG. 5C, dry etching is performed with respect to the organic coated film 24 by using the resist pattern 25 as a mask.

If the semiconductor integrated circuit device is of a DRAM unmounted type, dry etching is performed by introducing, into a chamber in which a pressure is adjusted to, e.g., 10 Pa, an etching gas composed of a gas mixture of $SO_2$ gas and $O_2$ gas each at a flow rate of 20 cc/min and applying a radio-frequency power (RF power) of 200 W to a sample stage. If the semiconductor integrated circuit device is of a DRAM mounted type, dry etching is performed by introducing, into the chamber in which the pressure is adjusted to 10 Pa, an etching gas composed of a gas mixture of $SO_2$ gas at a flow rate of 25 cc/min and $O_2$ gas at a flow rate of 20 cc/min and applying an RF power of 200 W to a sample stage. In the present embodiment, a gas flow rate is expressed by using a flow rate per minute in a standard state (0° C., 1 atmospheric pressure).

Thus, in the dry etching step performed with respect to the organic coated film 24, the etching condition is changed depending on the presence or absence of a mounted DRAM. Specifically, in the case of the DRAM mounted type, the flow rate of $SO_2$ gas having the effect of protecting a sidewall formed in the organic coated film 24 through etching is increased from 20 cc/min, which is used in the case of the DRAM unmounted type, to 25 cc/min. As a result, the organic coated film 24 can be patterned to have a desired size (0.15 μm) irrespective of the presence or absence of a mounted DRAM since a desired sidewall protecting effect per unit area is achievable even in the case where the area of the sidewall of the organic coated film 24 is increased by mounting a DRAM.

Figure 5D:
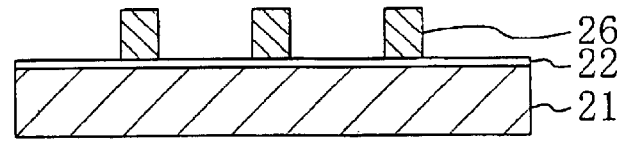

Next, dry etching is performed with respect to the polysilicon film 23 by using the resist pattern 25 or the patterned organic coated film 24 as a mask. Then, the resist pattern 25 and the organic coated film 24 are removed by ashing so that the gate electrodes 26 composed of the polysilicon film 23 are formed, as shown in FIG. 5D. Since the organic coated film 24 has been patterned to have a desired size irrespective of the presence or absence of a mounted DRAM, the gate electrodes 26 having a desired size (0.15 μm) can be formed by preventing the occurrence of the CD loss.

In the dry etching step performed with respect to the polysilicon film 23, dry etching is performed by introducing, into the chamber in which the pressure is adjusted to 20 Pa, an etching gas composed of a gas mixture of $Cl_2$ gas at a flow rate of 40 cc/min and HBr gas at a flow rate of 80 cc/min and applying an RF power of 300 W to the sample stage whether the semiconductor integrated circuit device is of the DRAM unmounted type or of the DRAM mounted type. In short, different facilities and conditions are used in the respective dry etching steps performed with respect to the polysilicon film 23 and to the organic coated film 24.

Thus, according to the fifth embodiment, the etching condition is changed depending on the presence or absence of a mounted DRAM in the step of performing dry etching with respect to the organic coated film 24 by using the resist pattern 25 corresponding to the gate electrodes 26 each having the linear pattern. Specifically, in the case of the DRAM mounted type, the flow rate of $SO_2$ gas having the effect of protecting the sidewall formed in the organic coated film 24 through etching is increased compared with the case of the DRAM unmounted type. This achieves a desired sidewall protecting effect per unit area even in the case where the area of the sidewall of the organic coated film 24 is increased by mounting a DRAM, so that the organic coated film 24 is patterned to have a desired size. By performing dry etching with respect to the polysilicon film 23 by using the patterned organic coated film 24 as a mask, the gate electrodes 26 having a desired size can be formed. This ensures the suppression of size variations in gate electrodes 26 resulting from difference in mask pattern layout associated with the presence or absence of a mounted DRAM and allows high-precision formation of the gate electrodes.

Figure 6:
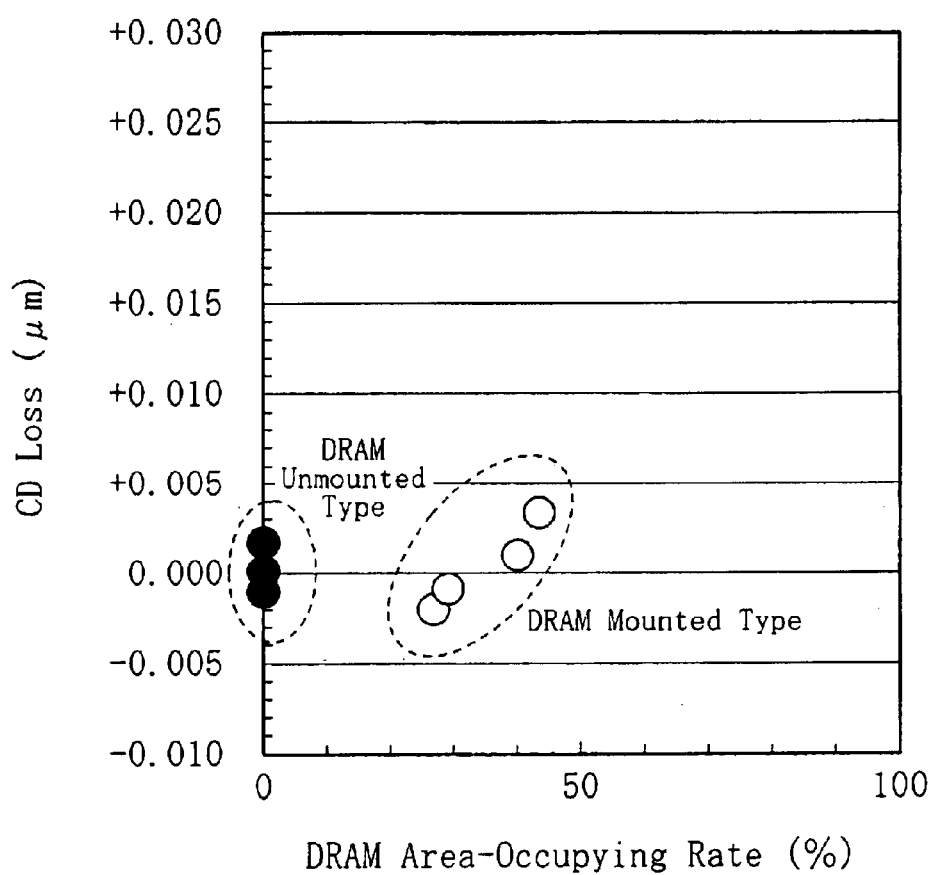
FIG. 6 shows the relationship between a CD loss and a DRAM area-occupying rate when various types of semiconductor integrated circuit devices with different DRAM area-occupying rates, including a DRAM unmounted type, are fabricated by using the method for fabricating semiconductor integrated circuit devices according to the fifth embodiment.

FIG. 6 shows the relationship between the CD loss (value obtained by subtracting the size of the completed gate electrode from the size of the resist pattern prior to etching) and the DRAM area-occupying rate when various types of semiconductor integrated circuit devices having different DRAM area-occupying rates, including a DRAM unmounted type, are fabricated by using the method for fabricating semiconductor integrated circuit devices according to the fifth embodiment.

As shown in FIG. 6, the fifth embodiment has achieved 0.15 m, which is the desired size of the gate electrode, by suppressing the occurrence of the CD loss irrespective of the presence or absence of a mounted DRAM.

Figure 7:
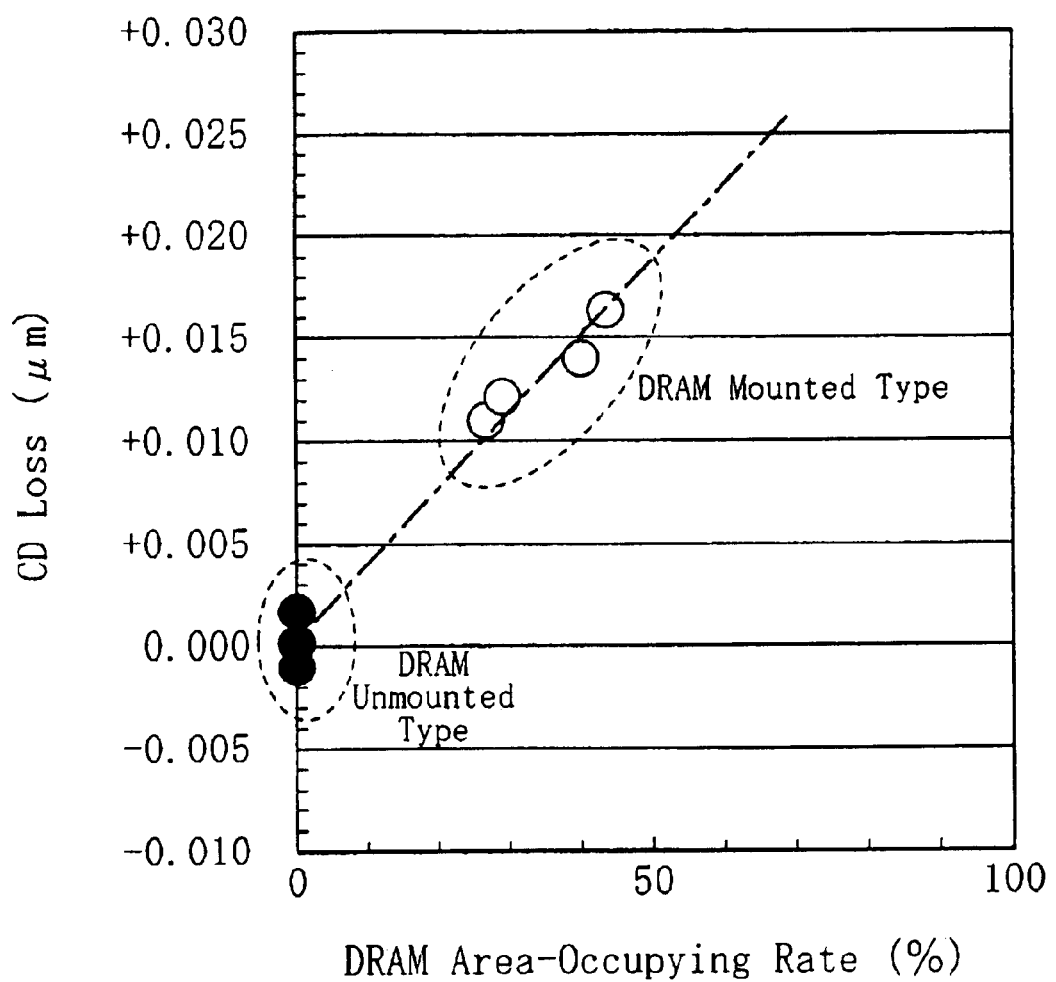
FIG. 7 shows, as a comparative example, the relationship between a CD loss and a DRAM area-occupying rate when various types of semiconductor integrated circuit devices with different DRAM area-occupying rates, including a DRAM unmounted type, are fabricated by using the same etching condition irrespective of the presence or absence of a DRAM.
Figure 8:
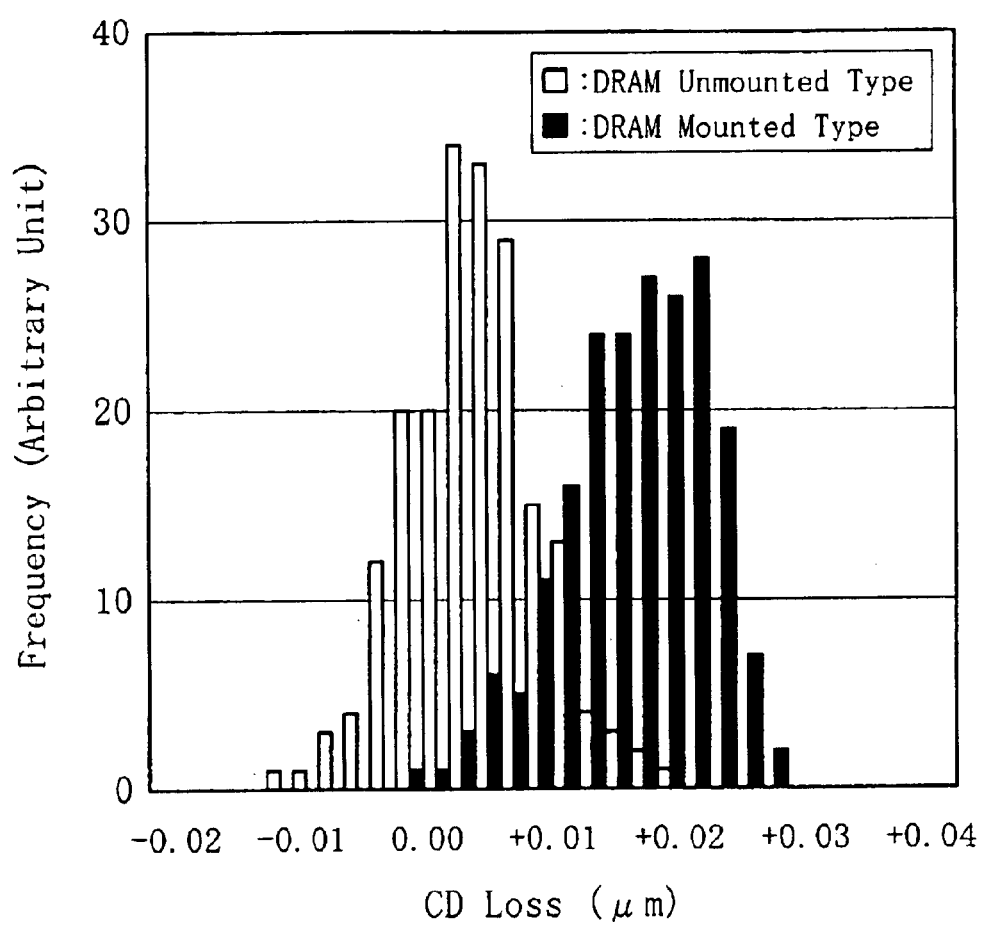
FIG. 8 shows the frequency distribution of a CD loss when a DRAM mounted type and a DRAM non-mounted type are fabricating by using the same gate-electrode forming process.
Figure 9:
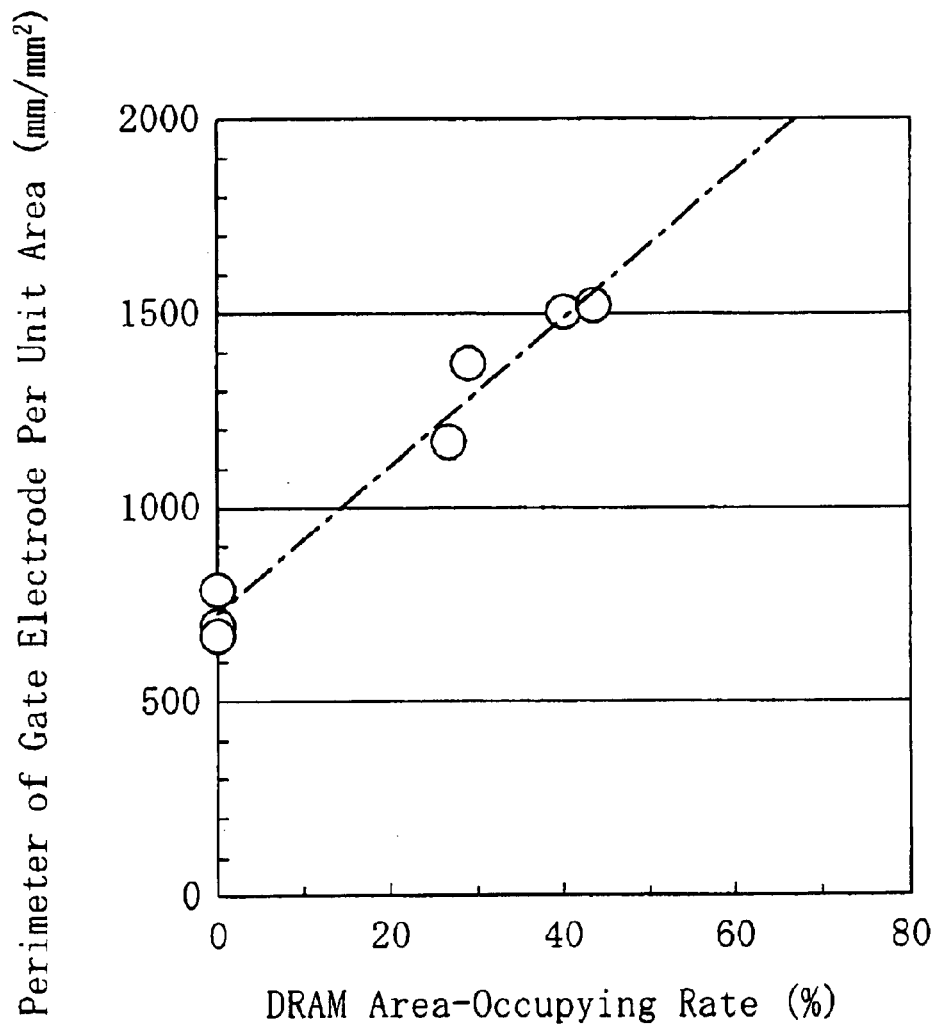
FIG. 9 shows the relationship between the perimeter of gate electrodes per unit area and a DRAM area-occupying rate in each of various types with different DRAM area-occupying rates including a DRAM unmounted type.

FIG. 7 shows, as a comparative example, the relationship between the CD loss and the DRAM area-occupying rate when various types of semiconductor integrated circuit devices having different DRAM area-occupying rates, including a DRAM unmounted type, are fabricated by using the same etching condition irrespective of the presence or absence of a mounted DRAM.

As shown in FIG. 7, the comparative example can suppress the occurrence of the CD loss in the DRAM unmounted type, while a CD loss of about 0.013 μm on average occurs in the DRAM mounted type.

Although the fifth embodiment has changed the etching condition for the organic coated film 24 depending on the presence or absence of a mounted DRAM (specifically, the flow rate of $SO_2$ gas having the effect of protecting the sidewall of the organic coated film 24) and used the common etching condition for the polysilicon film 23 irrespective of the presence or absence of a mounted DRAM, it is also possible to use the common etching condition for the organic coated film 24 irrespective of the presence or absence of a mounted DRAM and change the etching condition for the polysilicon film 23 depending on the presence or absence of a mounted DRAM. In this case, it is also possible to change the flow rate of HBr gas for forming, e.g., an etching reaction product ($SiBr_4$ or the like) having the effect of protecting the sidewall of the polysilicon film 23 as the sidewall protecting film depending on the presence or absence of a mounted DRAM. If a structure in which a silicon dioxide film or the like is formed on a polysilicon film is used as a gate electrode structure, size variations in gate electrode resulting from the presence or absence of a mounted DRAM may also be suppressed by changing the etching condition for the silicon dioxide film.

Although the fifth embodiment has changed the etching condition depending on the presence or absence of a mounted DRAM, it is also possible to finely change the etching condition depending on the DRAM area-occupying rate.

Although the fifth embodiment has assumed the formation of the gate electrode, the present invention is not limited thereto. The present invention is also applicable to the formation of another linear pattern such as a metal wire.

Although the fifth embodiment has assumed the system LSI on which memories such as DRAMs can be mounted, the present invention is not limited thereto. The present invention is also applicable to a system LSI on which another group of elements composed of a plurality of semiconductor elements arranged in a repetitive pattern can be mounted.

Embodiment 6

A semiconductor integrated circuit device and a method for fabricating the same according to a sixth embodiment of the present invention will be described with reference to the drawings. It is to be noted that the method for fabricating the semiconductor integrated circuit device according to the sixth embodiment assumes a method for fabricating a plurality of semiconductor integrated circuit devices each comprising a circuit pattern having a linear pattern and at least one of fabrication process steps for the semiconductor integrated circuit devices is common. By way of example, a description will be given herein below to a method for forming a gate electrode in a system LSI in which memories such as DRAMs having a repetitive pattern can be merged. Similarly to the fifth embodiment, FIGS. 5A to 5D illustrate the individual process steps of the method for fabricating the semiconductor integrated circuit device according to the sixth embodiment.

The sixth embodiment is different from the fifth embodiment as follows. The fifth embodiment has changed the etching condition depending on the presence or absence of a mounted DRAM in the step of performing dry etching with respect to the organic coated film 24 by using, as a mask, the resist pattern 25 corresponding to the gate electrodes 26 having the linear pattern (see FIGS. 5C and 5D). By contrast, the sixth embodiment changes the size of the resist pattern 25 in accordance with the DRAM area-occupying rate in the step of forming the resist pattern 25 (see FIG. 5B).

Specifically, the sixth embodiment predetermines the relationship between the CD loss (a value obtained by subtracting the size of the completed gate electrode from the size of the resist pattern prior to etching from) and the DRAM area-occupying area and thereby determines the size of the resist pattern by using, e.g., the following expression:

(Size of Resist Pattern)=(Expected Value of *CD* Loss Corresponding to *DRAM* Area-occupying rate)+(objective Size of Gate Electrode).

As shown in FIG. 7, the CD loss increases as the DRAM area-occupying rate increases. In accordance with the foregoing expression, therefore, the size of the resist pattern 25 is increased as the DRAM area-occupying rate increases, whereby the sixth embodiment achieves the following effect. That is, even if the area of a sidewall formed in the polysilicon film 23 or the organic coated film 24 through etching using the resist pattern 25 as a mask increases as the DRAM area-occupying rate increases and the sidewall protecting effect per unit area decreases accordingly, the decrement in sidewall protecting effect can be compensated for by adjusting the size of the resist pattern 25. This ensures the suppression of variations in the size of the gate electrode 26 resulting from difference in mask pattern layout associated with different DRAM area-occupying rates and thereby allows high-precision formation of the gate electrode.

Table 3 shows the size of the resist pattern for forming the gate electrode having the objective size of 0.15 μm when various types of semiconductor integrated circuit devices with different DRAM occupying-area rates, including a DRAM unmounted type, are fabricated by using the method for fabricating semiconductor integrated circuit devices according to the sixth embodiment. For reference purposes, Table 3 shows expected values of the CD loss corresponding to the individual DRAM area-occupying rates.

TABLE 3

| DRAM Area-occupying rate R (%) | CD Loss (μm) | Size of Resist Pattern (μm) |
| --- | --- | --- |
| R = 0 | 0.000 | 0.150 |
| 0<R≦20 | 0.008 | 0.158 |
| 20<R≦40 | 0.016 | 0.166 |
| 40<R≦60 | 0.024 | 0.174 |

By determining the size of the resist pattern 25 as shown in Table 3, the sixth embodiment has achieved 0.15 μm which is the desired size of the gate electrode irrespective of the DRAM area-occupying rate.

Although the sixth embodiment has changed the size of the resist pattern 25 in accordance with the DRAM area-occupying rate, it is also possible to coarsely change the size of the resist pattern 25 depending on the presence or absence of a mounted DRAM instead.

In the sixth embodiment, it is also possible to use, e.g., a method of adjusting a dose or adjusting the size of a mask pattern on a reticle as a specific method for adjusting the size of the resist pattern 25.

Although the sixth embodiment has assumed the formation of the gate electrode, the present invention is not limited thereto. The present invention is also applicable to the formation of another linear pattern such as a metal wire.

Although the sixth embodiment has assumed the system LSI on which memories such as DRAMs can be mounted, the present invention is not limited thereto. The present invention is also applicable to a system LSI on which another group of elements composed of a plurality of semiconductor elements arranged in a repetitive pattern can be mounted.

What is claimed is:

1. A semiconductor integrated circuit device comprising:
    a first circuit pattern having a first linear pattern and placed in a region in which a group of elements having a repetitive pattern are formed; and
    a second circuit pattern having a second linear pattern and placed in a region in which components other than the group of elements are formed,
    a dummy pattern being inserted in the region in which the second circuit pattern is placed such that a sum perimeter of the first linear pattern, the second linear pattern, and the dummy pattern per unit area is equal to or less than a perimeter of the first linear pattern per unit area.

2. The semiconductor integrated circuit device of claim 1, wherein the group of elements are memories.

3. The semiconductor integrated circuit device of claim 1, wherein a perimeter of the dummy pattern per unit area is 70% or more of the perimeter of the first linear pattern per unit area.

4. A semiconductor integrated circuit device comprising:
    a first circuit pattern having a first gate electrode pattern and placed in a memory circuit region; and
    a second circuit pattern having a second gate electrode pattern and placed in a logic circuit region,
    a dummy pattern being inserted in the logic region in which the second circuit pattern is placed such that a sum perimeter of the first gate electrode pattern, the second gate electrode pattern, and the dummy pattern per unit area is equal to or less than a perimeter of the first gate electrode pattern per unit area.

5. The semiconductor integrated circuit device of claim 4, wherein the dummy pattern has a rectangular like shape.

6. The semiconductor integrated circuit device of claim 4, wherein the perimeter of the dummy pattern per unit area is 70% or more of the perimeter of the first gate electrode pattern per unit area.

* * * * *